United States Patent [19]

Wright

[11] Patent Number: 4,616,197

[45] Date of Patent: Oct. 7, 1986

[54] RESONATOR

[75] Inventor: Peter V. Wright, Dallas, Tex.

[73] Assignee: R. F. Monolithics, Inc., Dallas, Tex.

[21] Appl. No.: 804,855

[22] Filed: Dec. 5, 1985

[51] Int. Cl.⁴ .................... H03H 9/25; H03H 9/64; H03H 9/145
[52] U.S. Cl. ................ 333/194; 310/313 D; 333/195; 333/196
[58] Field of Search ................ 333/150–155, 333/193–196; 310/313 R, 313 A, 313 B, 313 C, 313 D; 29/25.35; 331/107 A

[56] References Cited

U.S. PATENT DOCUMENTS

| 4,144,507 | 3/1979 | Shreve | 333/191 |
| 4,454,488 | 6/1984 | Hartmann | 333/195 |
| 4,504,758 | 3/1985 | Wisbey | 310/313 R |

Primary Examiner—Marvin L. Nussbaum
Attorney, Agent, or Firm—Sigalos & Levine

[57] ABSTRACT

A resonator, resonator filter having an output transducer of typical design and conductance response and an input transducer whose conductance response can be adjusted to offset adverse conductance response of said output transducer thereby providing a unique improved overall conductance response of the resonator, resonator filter.

11 Claims, 11 Drawing Figures

U.S. Patent    Oct. 7, 1986    Sheet 1 of 4    4,616,197
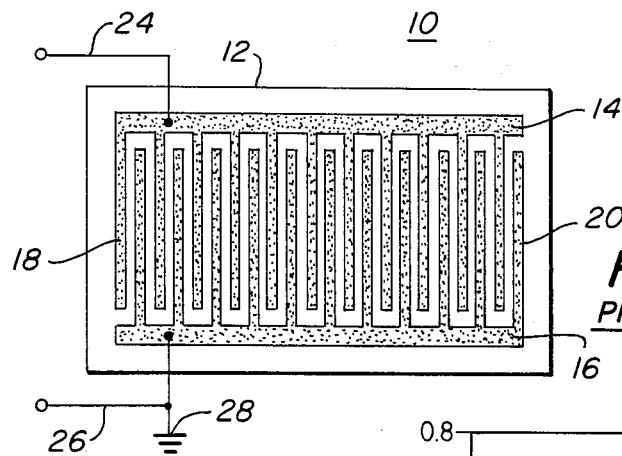
FIG. 1
PRIOR ART
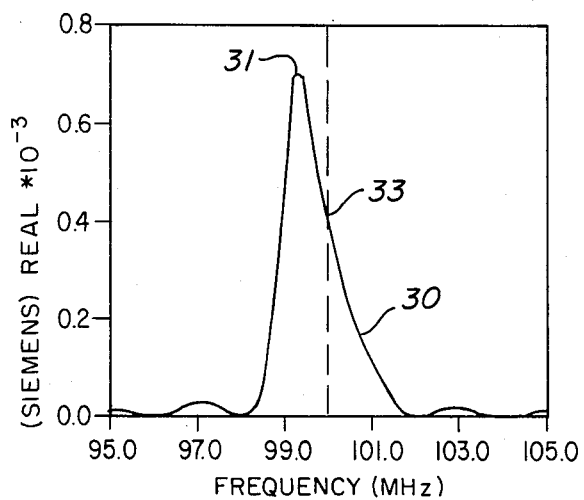
FIG. 2
PRIOR ART
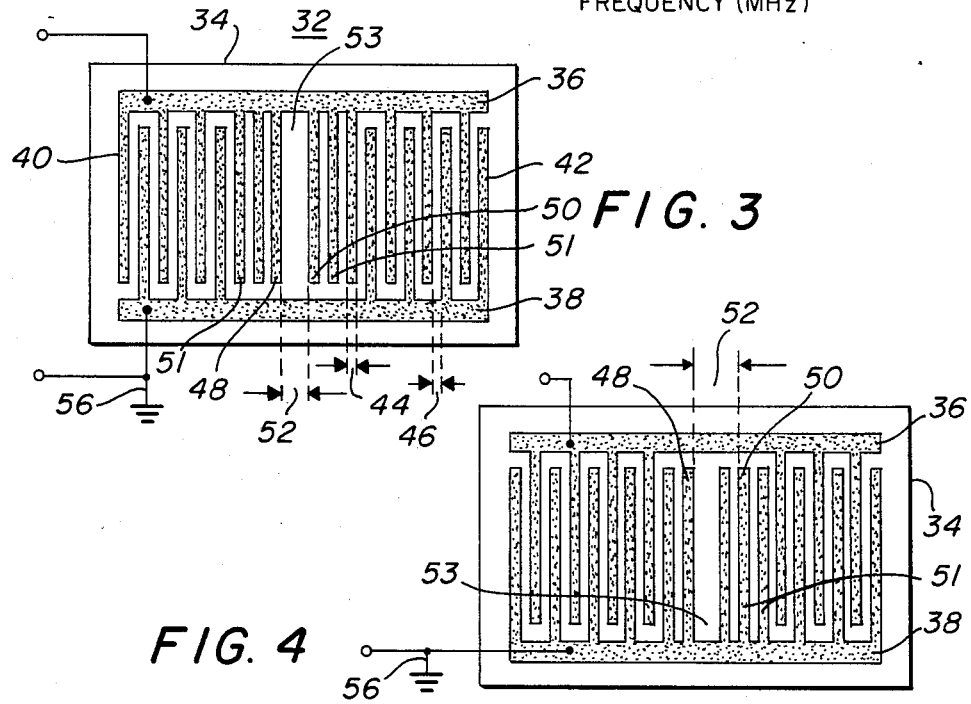
FIG. 3
FIG. 4

RESONATOR

BACKGROUND OF THE INVENTION

This invention relates to a transducer formed as a surface acoustic wave device which has better transduction characteristics for the same length transducer thus allowing a more compact device to be constructed, has a higher input conductance for the same length transducer and has a more symmetrical conductance thus providing less distortion to input signals applied thereto. It has particular utility in a resonator and a resonator-filter.

When conventional types of SAW transducers with two electrodes per wavelength are used as impedance elements, the conductance is maximum at a frequency offset from the impedance element design frequency because of the acoustic wave reflections occurring within the device. Thus, the conductance of the device at the design frequency is decreased because of the electrical reflections within the element. More importantly the peak of maximum conductance then is shifted from the design frequency.

Prior art two-port resonators such as those disclosed in U.S. Pat. No. 4,144,507 to Shreve and U.S. Pat. No. 4,454,488 to Hartmann also use SAW transducer elements having several spurious reponse peaks of different amplitude with the largest spurious peak at or near the frequency at which the resonator is desired to operate. However, under certain conditions it is possible that the device may lock onto the frequency exhibited at the highest amplitude adjacent peak. Of course, this is disadvantageous inasmuch as the resonator exhibits unstable operating conditions. Further, there may be a slight decrease in Q exhibited by the device due to the high amplitude adjacent peak.

SAW devices find large use in resonator filters because there are size and cost advantages which lead to replacing conventional LC bandpass filters. These resonator filters typically involve a piezoelectric substrate with interdigital input and output transducers formed on the substrate.

Although the frequency response has a major peak at the frequency at which it is desired that the resonator filter operate, the frequency response also shows several other spaced but lesser amplitude peaks at other frequencies close to the operating frequency. This, of course, allows unwanted frequencies to pass through the filter. To suppress the unwanted peaks, special steps must be taken such as using grooves or changing the frequency of the transducers with respect to the gratings which complicates both the construction and the operation of the resonator filter. See U.S. Pat. No. 4,325,037.

A unique two port resonator can be formed using a modified transducer element as the input transducer, a standard prior art transducer element as the output transducer and standard gratings used in conjunction with the input and output transducers. It has all of the advantages of existing two port resonator structures as shown and described in U.S. Pat. No. 4,144,507 to Shreve and U.S. Pat. No. 4,454,488 to Hartmann and, in addition, has essentially one major transmission peak at the design frequency instead of several. While there are other adjacent peaks, they are, to a great extent suppressed below the one major peak thus preventing an oscillator formed from the resonator from locking on to the frequency of the lower adjacent peaks as can happen with the prior art oscillators. In addition, the Q of the novel input transducer is slightly better than the prior art transducers.

The resonator and resonator filter of the present invention utilizes a modified input transducer and an output transducer of normal design. The novel input transducer provides an admittance response that more nearly peaks at the design frequency of the transducer and has a null in its input conductance which can be adjusted by withdrawal weighting, or other types of weighting, to occur at or near any desired frequency. However, the output transducer has a peak in the conductance, depending upon the substrate material and overlay, which will occur offset from the design frequency. By adjusting the null of the input transducer to coincide with the conductance peak of the output transducer, spurious responses of the resonator or resonator filter may be suppressed. Thus, a good net frequency response that is far improved over prior art responses is obtained. These results are obtained with $\lambda/4$ electrodes with no recessed or split finger electrodes, and without grooves or frequency shifts between the transducers and the gratings thereby allowing such filters to be designed at much higher frequencies and with a greater economy in construction.

SUMMARY OF THE INVENTION

Thus, it is an object of the present invention to provide a surface acoustic wave resonator filter comprising a substrate means having at least a surface layer of piezoelectric material on which acoustic waves may be propagated, first and second grating structures provided on said piezoelectric surface of said substrate means in juxtaposed spaced relationship, input and output spaced, aligned transducers interposed between said first and second grating structures, each said input and output transducer comprising opposed conductive transducer pads defined on said substrate as signal terminals, and a plurality of interdgitated electrodes having a width of $\lambda/4$ and having a spacing of $\lambda/4$ extending from said opposed pads to form an elongated transducer, one adjacent pair of said electrodes at approximately the center of only said input transducer having a spacing forming a cavity with a width of $(N)\lambda/2$ where N is an integer, and a third grating structure interposed between said input and output transducers and being resonant at the same frequency as said input and output transducers.

It is also an object of the present invention to provide a surface acoustic wave resonator comprising substrate means having at least a surface layer of piezoelectric material on which acoustic waves may be propagated, first and second grating structures provided on said piezoelectric surface of said substrate means in juxtaposed spaced relationship, input and output transducers interposed between said grating structures and each comprising opposed conductive transducer pads defined on said substrate, a plurality of interdigitated electrodes having a width of $\lambda/4$ and having a spacing of $\lambda/4$ extending from said opposed transducer pads to form elongated input and output transducers, and one adjacent pair of said electrodes at approximately the center of only said elongated input transducer with a spacing forming a cavity with a width of $(N)\lambda/2$ where N is an integer.

BRIEF DESCRIPTION OF THE DRAWINGS

These and other objects of the present invention will be disclosed in relation to the accompanying drawings in which:

FIG. 1 illustrates a SAW transducer impedance element of the prior art;

FIG. 2 is a graph of the typical input conductance versus frequency of the prior art impedance element of FIG. 1;

FIG. 3 is an illustration of a novel input SAW transducer element for use in a single port resonator or resonator filter of the present invention and in which a cavity is formed at approximately the center of the elongated transducer having a width of (N) $\lambda/2$ where N is an integer and being formed by first and second adjacent electrodes extending from the same conductive pad and having an even number of extra dummy electrodes on either side of the cavity to shift the null created by the transducer to the low side of the design frequency;

FIG. 4 is an alternate version of the SAW impedance element of FIG. 3 in which the cavity is of the same width as that in FIG. 3 and is formed by adjacent electrodes extending from the opposite conductive pad from that shown in FIG. 3 and includes an odd number of dummy electrodes on either side of the cavity to shift the null created by the transducer to the high side of the design frequency;

DETAILED DESCRIPTION OF THE DRAWINGS

Figure 5:
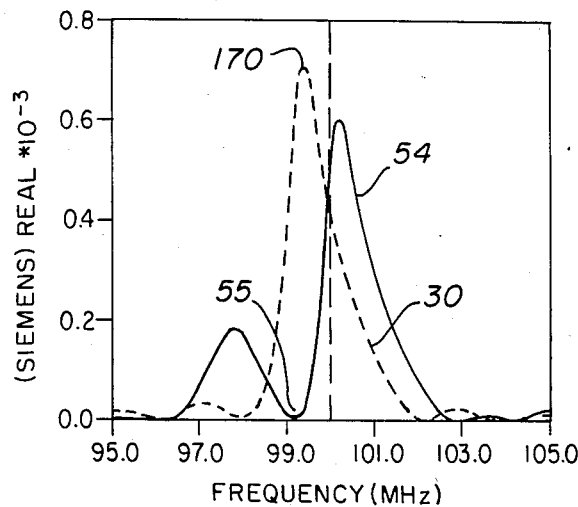
FIG. 5 illustrates the conductance curve of the impedance element of FIG. 3 as compared with the typical conductance wave form shown in FIG. 2 of the prior art transducer.

FIG. 1 illustrates a typical prior art transducer element formed as a SAW impedance element which can be used in a single port resonator device with the addition of necessary reflectors, the impedance element 10 comprising substrate 12 having at least a surface layer of piezoelectric material thereon through which acoustic waves may be propagated. Opposed conductive transducer pads 14 and 16 are defined on said substrate 12 in a well known manner and include a plurality of interdigitated surface acoustic wave electrodes 18 and 20 extending from said opposed pads 14 and 16 respectively and forming an elongated transducer. Leads 24 and 26 are connected to conductive transducer pads 14 and 16 respectively as input and output terminals. One of the transducer pads, such as conductive pad 16, may be grounded as at 28. The number of interdigitated electrodes 18 and 20 may, of course, vary but a large number of them are used under normal conditions to form transducer 10. Only a few of the electrodes 18 and 20 are shown in FIG. 1 for purposes of simplicity of the drawings. The electrodes 18 and 20 have a width of $\lambda/4$ and are spaced by $\lambda/4$ and the device has two electrodes per wavelength.

The typical input conductance characteristic for a prior art two electrode per wavelength transducer 10 as in FIG. 1 shown looking into terminals 24 and 26 is illustrated in FIG. 2. It will be noted that the conductance wave form 30 in FIG. 2 is not entirely symmetrical. The conductance of the device is a maximum at peak 31 at a frequency offset below the design frequency of the impedance element 10 because of acoustic wave reflections occurring within the device. Thus, the conductance of the device at the design frequency, for example 100 MHz in FIG. 2, is shown at 33 and, as can be seen, it is substantially lower than peak 31 thus decreasing the efficiency of the device at the design frequency. The peak 31 may occur at a frequency offset above the design frequency depending on the choice of substrate material and electrode metal used in the construction of the transducer.

The modified novel transducer element to be used with applicant's present invention is disclosed in FIGS. 3 and 4 as an impedance element 32 which comprises a substrate 34 having at least a surface layer of piezoelectric material on which acoustic waves may be propagated. Opposed conductive transducer pads 36 and 38 are defined on substrate 34 in a well known manner and include a plurality of interdigitated electrodes 40 and 42 respectively. Each of the electrodes has a width of $\lambda/4$ as illustrated at 44 and are separated by a space also having a width of $\lambda/4$ as illustrated at 46. A plurality of electrodes 40 extend from conductive transducer pad 36 and are interdigitated with a plurality of electrodes 42 extending from transducer pad 38. One adjacent pair of electrodes 48 and 50 extending from the same transducer pad 36 is located at approximately the center of the elongated transducer 32 $\pm 20\%$ and the adjacent electrodes 48 and 50 are separated by a space of $\lambda/2$ as indicated at 52 to form a cavity 53. Because electrodes 48 and 50, as shown, both extend from transducer pad 36, both have the same polarity. The important feature of the present invention, however, is to change the periodicity between the electrodes on either side of the center of the transducer. Thus, in FIG. 3, either electrodes 48 or 50 could also be eliminated as shown in FIG. 4 with little change in the operation of the device. The cavity 53 at the center ($\pm 20\%$) of the transducer should be of a width of $(N)\lambda/2$ where N is an integer. In FIGS. 3 and 4, N=1. Obviously, the greater N becomes, the less efficient the transducer element becomes. Thus, the ideal cavity width is $\lambda/2$.

The conductance response characteristic of this transducer shown in FIG. 3 is illustrated in FIG. 5 as curve 54 which is compared to dashed curve 30, the same curve illustrated in FIG. 2 for the typical prior art impedance element device. Note that the conductance characteristic 54 of the transducer in FIG. 3 is shifted further to the right than curve 30 thus providing a greater conductance at the design frequency (100 MHz in this case) than the prior art device. The reason that the conductance response curve 54 is shifted to the right is because the cavity 53 causes poorer conductance of the transducer 32 at frequencies lower than the design frequency as shown by the null 55 in FIG. 5 and the net effect is that the greatest peak of the conductance is nearer the design frequency. The position of null 55 can be varied or controlled by withdrawal weighting of the transducer electrodes as by adding an even number of dummy electrodes 51 on either side of cavity 53 in FIG. 3 or an odd number of dummy electrodes 51 on only one side of cavity 53 as shown in FIG. 4. In FIG. 3, the device will cause the null to occur on the low side of the design frequency as shown in FIG. 5 while the device in FIG. 4 will cause the null to occur on the high side of design frequency. The total number of dummy electrodes 51 determine the exact location of the null 55.

An alternate embodiment of the impedance element of FIG. 3 is illustrated in FIG. 4. The only difference in the two embodiments is that in FIG. 4, the cavity width is caused by the adjacent electrodes 48 and 50 which depend from opposite pad 38. Essentially the same impedance characteristic is obtained as illustrated in FIG. 5 except that the peak will be on the low side and the null 55 on the high side of the design frequency.

Figure 6:
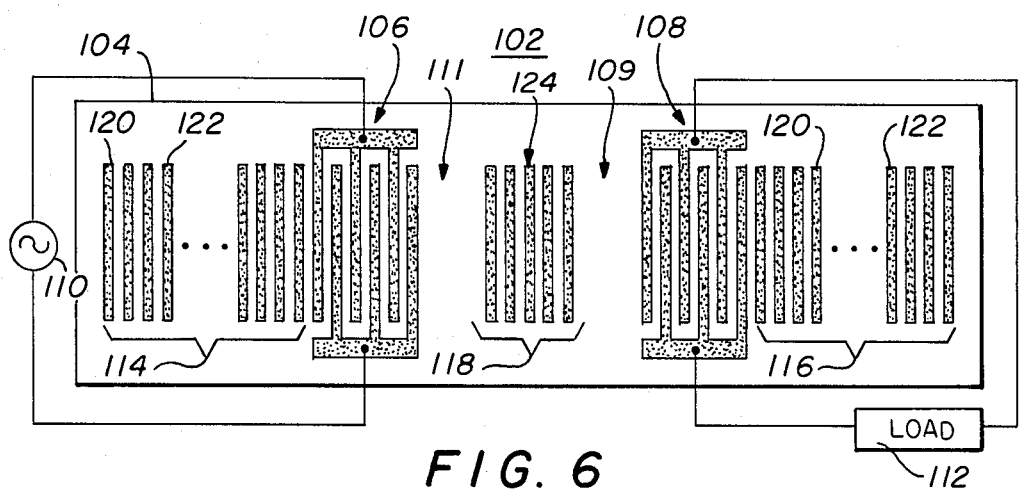
FIG. 6 illustrates a typical SAW two port resonator or resonator filter of the prior art construction.

FIG. 6 is an illustration of a simple prior art two port resonator or resonator filter 102 utilizing SAW devices. If there is a change in periodicity between the input and output transducers, whether with or without discontinuities 118, the device is a two port resonator with a single main peak in the frequency response. If the device is a resonator filter, intermediate grating 118 is necessary with cavity 111 creating a first change in periodicity and cavity 109 creating a second change in periodicity. The cavities 109 and 111 are separated by a coupling grating 118. As can be seen generally in FIG. 6, piezoelectric substrate 104 has thereon an input transducer 106 and an output transducer 108 which are disposed in a spaced apart aligned relationship. The input transducer 106 is driven by a signal source 110 and a load 112 is coupled to the output transducer 108. As is well known in the art the surface acoustic waves induced by transducer 106 travel through the piezoelectric substrate 104 and are recovered by the output electrodes of transducer 108. Only a few interdigitated electrodes are shown forming each of the input and output transducers 106 and 108 for purposes of simplicity. It will be understood that a large number of electrodes is normally used to form each of these transducers.

First and second reflective grating structures 114 and 116 are provided on the substrate 104, and each of the reflective grating structures 114 and 116 comprise a respective plurality of discontinuities 120 and 122. These discontinuities 120 and 122 are formed at the surface of the substrate 104 so as to be capable of reflecting at least a portion of any surface waves incident thereon. As is well known in the art, the discontinuities 120 and 122 of the grating structures 114 and 116 are formed as a plurality of narrow thin film fingers or bars deposited on the surface of the substrate 104. They could, of course, also be formed by selectively etching portions of the surface of substrate 104.

Grating structures 114 and 116 are arranged on the substrate 104 in spaced apart, aligned relationship. The input and output surface acoustic wave transducers 106 and 108 are disposed on substrate 104 in the space between grating structures 114 and 116. The input transducer 106 is coupled to an input excitation source 110. The output transducer 108 is coupled to a load 112. As is well known in the art, the presence of the two reflecting grating structures 114 and 116 on the surface of substrate 104 results in a standing wave resonance being set up between the two reflecting structures with a band width which is controlled by the residual losses in the system. Proper realization of the standing wave resonance requires that the two reflecting grating structures 114 and 116 be separated by approximately an integral number of half wavelengths along the surface of substrate 104.

The third intermediate grating structure 118 may be added for uniformity of velocity throughout the structure when the device is a resonator.

Figure 7:
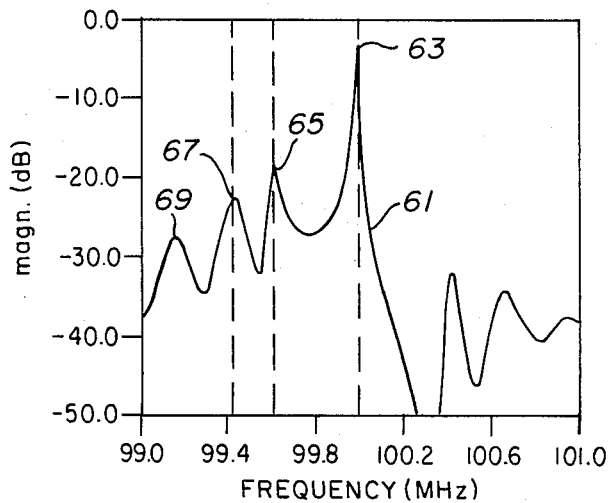
FIG. 7 is a graph of the wave form illustrating the frequency response of the prior art two port resonator shown in FIG. 6.

If the prior art device in FIG. 6 is a resonator as disclosed earlier, the wave form illustrating the frequency at which the device resonates is shown in FIG. 7.

Notice that curve 61 has a single main peak 63 and an adjacent suppressed peak 65 which are separated in amplitude by approximately 14 dB. There are still third adjacent peaks 67 and 69 which are suppressed even lower. These peaks 65, 67 and 69 are substantially large in magnitude because of the conductance characteristic of the standard SAW transducer as shown and explained in regard to FIG. 2 wherein it was shown that the device conducts well at frequencies below the design frequency (see peak 31 in FIG. 2). Note in FIG. 7 that the peaks 65, 67 and 69 are all occurring between 99 MHz and 100 MHz in this example and wherein 100 MHz is the frequency at which the maximum peak 63 of conductance of curve 30 in FIG. 2 occurs. Because of the substantially large amplitude of adjacent peak 65 shown in FIG. 7, it is possible, when the device is used in an oscillator, that the frequency of the oscillator may suddenly lock on to the frequency at peak 65 instead of peak 63 because they are in such close proximity in magnitude and frequency. This, of course, creates instability in the oscillator and is a problem which must be encountered in the prior art.

Figure 8:
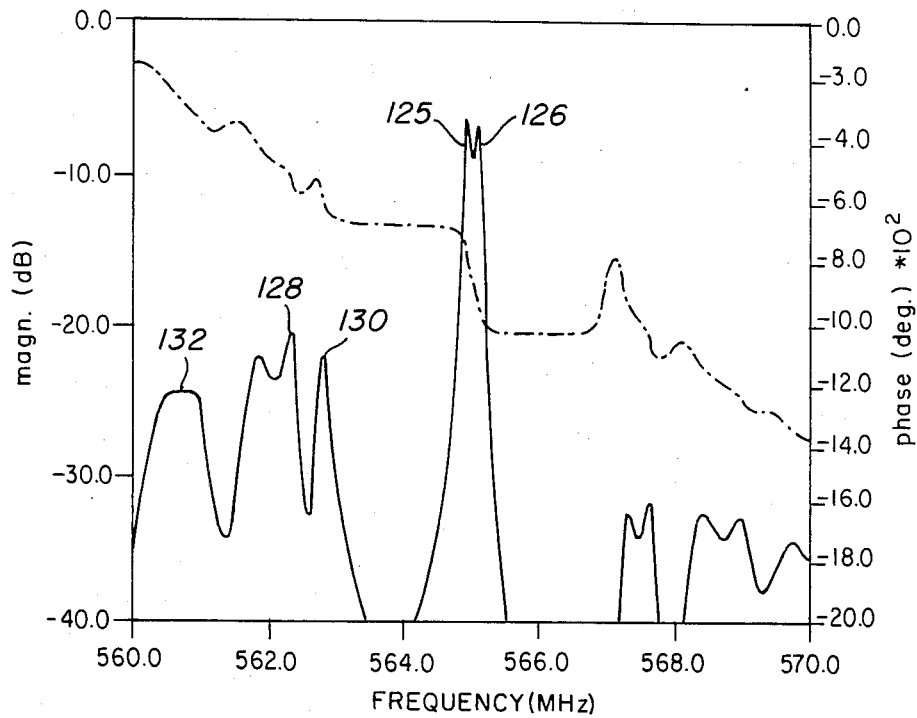
FIG. 8 is a graph of the wave form illustrating the frequency response of the prior art resonator filter shown in FIG. 6.

When the prior art device in FIG. 6 is a resonator filter as disclosed earlier, the wave form illustrating the frequency response or the coupling between transducers 106 and 108 is shown in FIG. 8. As can be seen in FIG. 8, two major peaks 125 and 126 occur at substantially the resonant frequency, for example 565 MHz in FIG. 8. However, a substantial number of smaller peaks 128, 130 and 132 are also present at lower frequencies indicating that the filter is transducing or passing frequencies of substantial magnitude below the resonant frequency designated by curve 126. This, of course, creates a problem with a resonator filter because instead of just passing the frequencies in the narrow band designated by peaks 125 and 126, it also passes the frequencies designated by peaks 128, 130 and 132. In order to suppress peaks 128, 130 and 132 to a sufficient degree to allow the filter to be operable, the filter has to be modified, as is well known in the art, in a number of ways. One method is to utilize grooves for the discontinuities forming the grating structures 114 and 116. This, of course, requires highly accurate construction and it is very expensive. Another method is to change the frequency of the transducers 106 and 108 with respect to the grating structures 114 and 116. This is disadvantageous in that the device is now responsive to two different frequencies which have a tendency to conflict with each other and create distortions. Such construction increases design complexity and is very expensive.

These problems with the prior art resonator filter are overcome by utilizing the novel transducer element of the present invention. The novel device 134 in FIG. 9 may be either a resonator or a resonator filter. The device 134 again comprises a substrate 136 on which an input transducer 138 and an output transducer 140 are located. Again, first and second reflective gratings 142 and 144 are placed in spaced, aligned relationship with each other and are separated by input and output transducers 138 and 140. In the present case, however, input transducer 138 has the cavity 150 which is of a width of (N)λ/2 as explained previously while the remainder of the electrodes in input transducer 138 and all of the electrodes forming transducer 140 are of a width of λ/4 and are separated by a space of λ/4. In addition, space 148 exists between a third grating structure 146 and the output transducer 140 when the device 134 functions as a resonator filter. Space or cavity 148 can be placed on the opposite side of the output transducer 140 if desired without significantly changing the operation of the device. The third grating structure 146 may be added for uniformity of velocity when the device is used as a resonator. Grating structure 146 forms a continuation of the discontinuities representing the electrodes of input transducer 138. Input signal source 156 excites the input transducer 138 while load 158 is coupled to the output transducer 140. The use of dummy electrodes 151 causes null 55 shown in FIG. 5 to be positioned as desired.

Figure 9:
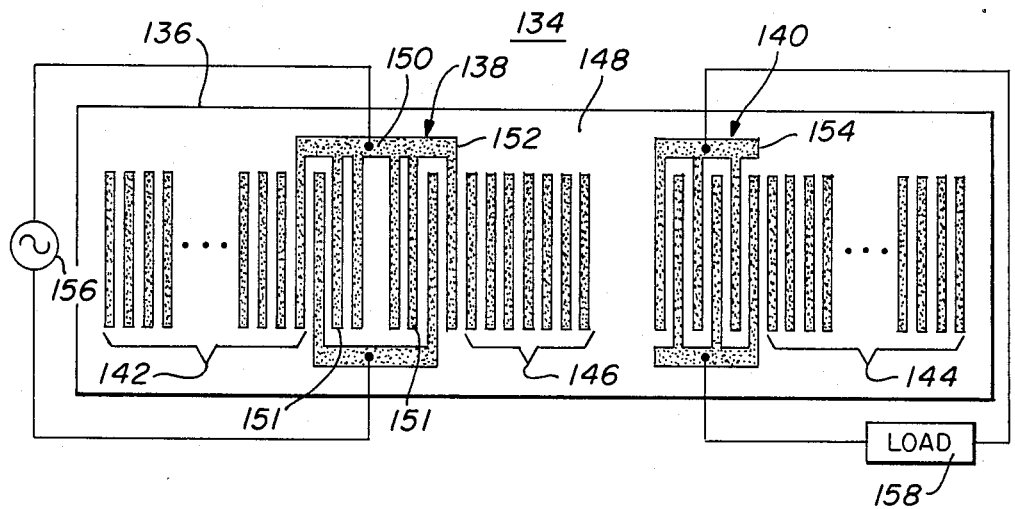
FIG. 9 is a representation of the novel two port resonator or resonator filter of the present invention utilizing the novel transducer element as the input transducer.
Figure 10:
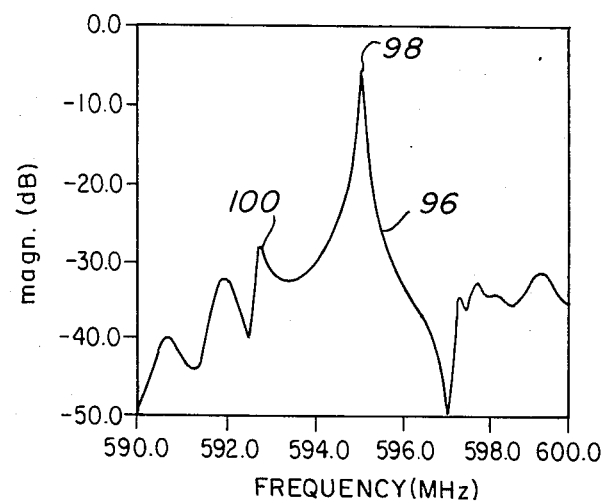
FIG. 10 illustrates the coupling between the input and output transducers of the novel resonator in FIG. 9.

FIG. 10 is a graph illustrating the frequency response curve of device 134 shown in FIG. 9 when it is used as a resonator. Again, curve 96 has two major peaks, 98 and 100. However, almost 25 dB separates the magnitude of peaks 98 and 100 thus providing such a wide disparity of coupling that in an oscillator, the device will not lock on to the frequency represented by peak 100. The depressed peak 100 is caused by the null 55 in FIG. 5 initiated by the cavity 150 and positioned by dummy electrodes 151 in the resonator of FIG. 9. Thus, the resonator is extremely stable and does not have the frequency shift problems of the prior art.

As stated, the frequency response of the element in FIG. 3 and FIG. 4 and the resonator or resonator filter shown in FIG. 9 can be arbitrarily adjusted by positioning null 55 as previously described as is well known in the art by modifying the reflection gratings as necessary. For instance, the electrodes of the resonator can be weighted as shown in FIG. 3 and 4 or apodized to adjust the input admittance response curve null 55 as desired. Weighting of the electrodes can be done in a number of ways well known in the prior art such as withdrawal weighting, varying the thickness of the electrodes overlay material, adding grooves to the substrate and the like.

Figure 11:
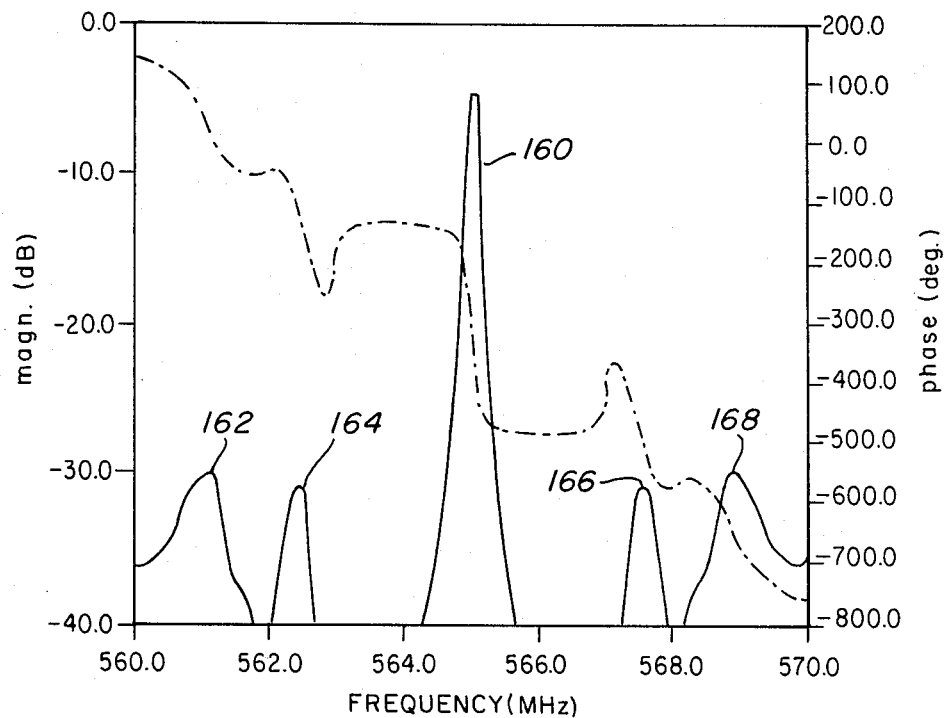
FIG. 11 illustrates the improved coupling that exists between the input and output transducers of the novel resonator filter in FIG. 9.

When the device in FIG. 9 is used as a resonator filter as described previously, the resulting frequency response curve indicating the coupling between the input and output transducers in FIG. 9 is shown in FIG. 11. Note the large peak 160 with smaller lobes 162, 164, 166 and 168. All of these smaller lobes 162 through 168 are so suppressed in relation to the magnitude of curve 160 by the positioning of null 55 that they are of minimal effect and the resonator filter functions in the manner which it is intended. The reason that the side lobes 162 and 164 are so suppressed is because of the combination of the novel input transducer 138 with the cavity 150 being utilized with a conventional output transducer 140 in FIG. 9. The reasoning can be explained in relationship to FIG. 5 with the conductive wave forms shown therein where the novel input transducer 138 is utilized in conjunction with the standard output transducer 140. These two transducers have the conductance responses as shown in FIG. 5. Thus, the dashed curve 30 is the conductance of the standard output transducer 140 while the curve 54 is the conductance of the novel transducer element 138. As can be seen in FIG. 5, the input transducer 138 does not transduce well at frequencies below the design frequency as evidenced by null 55. Just the opposite occurs with a standard transducer 140. It conducts well at frequencies below the design frequency as evidenced by the peak 170. Using withdrawal weighting by adding the desired even number of dummy electrodes 151 in FIG. 9, null 55 can be positioned with respect to peak 170 so as to reduce the transduction of the total device 134 at the frequency of peak 170. Thus, the two transducers tend to produce opposite effects at the frequency of peak 170 offset from the design frequency which tend to cancel each other and reduce the side frequency conduction as shown by peak 100 in FIG. 10. Thus, as will be noted in FIG. 5, the modified resonator used as the input transducer 138 in FIG. 9 conducts better at frequencies higher than the design frequency than does the standard resonator 140. The magnitude of the frequency passed as indicated by peak 100 in FIG. 10 is still so far below the maximum conduction frequency peak 98 that no ill effects are noted in the resonator-filter.

Thus, there has been disclosed a two port resonator and resonator filter which has a better impedance characteristic for the same length of transducer, is more compact, has a higher input conductance per length than the prior art, has a more symmetrical conductance and provides better coupling between the input and output transducers. As a resonator, the novel resonator has all of the advantages of existing resonator structures except that it does not change frequency inadvertently as in the prior art where the response curve has two peaks which are relatively close together in magnitude. As a resonator filter, it attenuates the design frequencies very little while suppressing to a great degree the frequencies outside the design.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:
1. A surface acoustic wave resonator filter comprising:
   a. a substrate means having at least a surface layer of piezoelectric material on which acoustic waves may be propagated,
   b. first and second grating structures provided on said piezoelectric surface of said substrate means in juxtaposed spaced relationship,
   c. input and output spaced, aligned transducers interposed between said first and second grating structures, each said input and output transducer comprising:
      (i) opposed conductive transducer pads defined on said substrate as signal terminals, and
      (ii) a plurality of interdigitated electrodes having a width of λ/4 and having a spacing of λ/4 extending from said opposed pads to form an elongated transducer,
   d. one adjacent pair of said electrodes at approximately the center of only said input transducer having a spacing forming a cavity with a width of (N)λ/2 where N is an integer, and e. a third grating structure interposed between said input and output transducers and being resonant at the same frequency as said input and output transducers.

2. A filter device as in claim 1 wherein said spacing of said adjacent pair of electrodes is located at the center of said elongated transducer plus or minus 20% of said elongated transducer length.

3. A resonator filter as in claim 1 further including a predetermined even number of dummy electrodes on both sides of said cavity whereby the conductance of said input transducer may be adjusted.

4. A method of forming a surface acoustic wave resonator filter comprising the steps of:
  a. forming a substrate having at least a surface layer of piezoelectric material on which acoustic waves may be propagated,
  b. providing first and second grating structures on said piezoelectric surface of said substrate means in juxtaposed spaced relationship,
  c. forming input and output spaced, aligned transducers of opposed conductive transducer pads on said substrate interposed between said first and second grating structures,
  d. extending a plurality of interdigitated electrodes from said opposed pads of said input and output transducers to form elongated transducers, said electrodes having a width of λ/4 and having a spacing of λ/4,
  e. forming one adjacent pair of said electrodes at approximately the center of only said input transducer with a spacing of (N)λ/2 where N is an integer, and
  f. interposing a third grating structure between said input and output transducers, said third structure being resonant at the same frequency as said input and output transducers.

5. A method as in claim 4 further comprising the step of locating said spacing of said adjacent pair of electrodes at the center of said elongated transducer plus or minus 20% of said elongated transducer length.

6. A surface acoustic wave resonator comprising:
  a. substrate means having at least a surface layer of piezoelectric material on which acoustic waves may be propagated,
  b. first and second grating structures provided on said piezoelectric surface of said substrate means in juxtaposed spaced relationship,
  c. input and output transducers interposed between said grating structures and each comprising opposed conductive transducer pads defined on said substrate,
  d. a plurality of interdigitated electrodes having a width of λ/4 and having a spacing of λ/4 extending from said opposed transducer pads to form elongated input and output transducers, and
  e. one adjacent pair of said electrodes at approximately the center of only said elongated input transducer with a spacing forming a cavity with a width of (N)λ/2 where N is an integer.

7. A resonator as in claim 6 wherein said spacing of said adjacent pair of electrodes is located at the center of said elongated input transducer plus or minus 20% of said elongated transducer length.

8. A resonator as in claim 6 further including a predetermined even number of dummy electrodes on both sides of said cavity whereby the conductance of said input transducer may be adjusted.

9. A method of forming a surface acoustic wave resonator comprising the steps of:
  a. forming a substrate having at least a surface layer of piezoelectric material on which acoustic waves may be propagated,
  b. providing first and second grating structures on said piezoelectric surface of said substrate means in juxtaposed spaced relationship,
  c. forming input and output spaced, aligned transducers of opposed conductive transducer pads on said substrate interposed between said grating structures,
  d. extending a plurality of interdigitated electrodes from said opposed pads of each of said input and output transducers to form elongated transducers, said electrodes having a width of λ/4 and having a spacing of λ/4, and
  e. forming one adjacent pair of said electrodes at approximately the center of only said input transducer, said adjacent pair of electrodes having a spacing of (N)λ/2 where N is an integer.

10. A method as in claim 9 further comprising the step of locating said spacing of said adjacent pair of electrodes at the center of said elongated input transducer plus or minus 20% of said elongated input transducer length.

11. A method of forming a two port resonator comprising the steps of:
  a. forming an input transducer on a substrate having a conductance peak substantially at design frequency and a conductance null offset from said design frequency which null represents poor conductance of said input transducer at said offset frequency,
  b. forming an output transducer on said substrate spaced from and acoustically coupled to said input transducer and which has a conductance response with a peak offset from the design frequency of said output transducer at said offset frequency, and
  c. adjusting the position of said offset conductance null of said input transducer to substantially coincide with the offset conductance peak of said output transducer without substantially affecting the conductance peak of said input transducer to provide a combined output conductance response which is reduced at said offset frequency thereby reducing spurious responses of said resonator.

* * * * *